US010756718B2

(12) United States Patent
Lee et al.

(10) Patent No.: US 10,756,718 B2
(45) Date of Patent: Aug. 25, 2020

(54) GATE DRIVING APPARATUS FOR POWER SEMICONDUCTOR DEVICE

(71) Applicants: Hyundai Motor Company, Seoul (KR); Kia Motors Corporation, Seoul (KR)

(72) Inventors: Ki Jong Lee, Gyeonggi-do (KR); Ji Woong Jang, Gyeonggi-do (KR); Kang Ho Jeong, Gyeongsangnam-do (KR); Sang Cheol Shin, Gyeonggi-do (KR); Han Geun Jang, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/199,344

(22) Filed: Nov. 26, 2018

(65) Prior Publication Data

US 2020/0127655 A1 Apr. 23, 2020

(30) Foreign Application Priority Data

Oct. 19, 2018 (KR) .......................... 10-2018-0125374

(51) Int. Cl.
| | |
|---|---|
| *H03K 17/04* | (2006.01) |
| *H03K 17/042* | (2006.01) |
| *H03K 17/082* | (2006.01) |

(52) U.S. Cl.
CPC ....... *H03K 17/0406* (2013.01); *H03K 17/042* (2013.01); *H03K 17/0828* (2013.01)

(58) Field of Classification Search
CPC ............... H03K 17/00; H03K 17/0406; H03K 17/04126; H03K 17/042; H03K 17/063;
(Continued)

(56) References Cited

U.S. PATENT DOCUMENTS

| | | | | |
|---|---|---|---|---|
| 2010/0265746 | A1* | 10/2010 | Ishikawa | .......... H03K 17/08128 363/131 |
| 2013/0285712 | A1* | 10/2013 | Kanschat | ............... H03K 17/00 327/109 |
| 2018/0205372 | A1* | 7/2018 | Sasaki | ................ H03K 17/0828 |

FOREIGN PATENT DOCUMENTS

| | | |
|---|---|---|
| JP | 2002-125363 A | 4/2002 |
| JP | 4675302 B2 | 4/2011 |

(Continued)

*Primary Examiner* — Lincoln D Donovan
*Assistant Examiner* — Dave Mattison
(74) *Attorney, Agent, or Firm* — Mintz Levin Cohn Ferris Glovsky and Popeo, P.C.; Peter F. Corless (57) ABSTRACT

A gate driving apparatus for a power semiconductor device may include: a first off-resistor and a second off-resistor each having a first end connected to a gate of the power semiconductor device; a first off-switch configured to determine a connection state between a second end of the first off-resistor and a ground based on a gate driving signal for determining an on/off state of the power semiconductor device; a second off-switch configured to determine a connection state between a second end of the second off-resistor and the ground; an electric current detector configured to detect an electric current flowing from a collector (drain) of the power semiconductor device to an emitter (source) of the power semiconductor device; and a controller configured to determine an open/closed state of the second off-switch based on the gate driving signal and a magnitude of the electric current detected by the electric current detector.

12 Claims, 4 Drawing Sheets

(58) Field of Classification Search
CPC ........... H03K 17/0826; H03K 17/0828; H03K 17/601; H03K 2217/00; H03K 2217/0036
USPC ........................................................ 327/109
See application file for complete search history.

(56) References Cited

FOREIGN PATENT DOCUMENTS

| | | |
|---|---|---|
| JP | 5510572 B2 | 6/2014 |
| KR | 20170132922 A | 12/2017 |

* cited by examiner

GATE DRIVING APPARATUS FOR POWER SEMICONDUCTOR DEVICE

The present application claims priority to Korean Patent Application No. 10-2018-0125374, filed on Oct. 19, 2018 in the Korean Intellectual Property Office, the entire contents of which are incorporated herein by reference.

BACKGROUND OF THE DISCLOSURE

Field of the Disclosure

The present disclosure generally relates to a gate driving apparatus for a power semiconductor device and, more particularly, to a gate driving apparatus that can reduce the capacity of an off-resistor connected to a gate of the power semiconductor device based on an electric current flowing from a collector (drain) of the power semiconductor device to an emitter (source) thereof, thereby reducing turn-off loss of the power semiconductor device and increasing efficiency.

Description of the Related Art

As interest in addressing global warming and environmental pollution has increased, research and development have been directed to environmental-friendly vehicles capable of reducing environmental pollution. As a result, the market for environmentally-friendly vehicles is expanding. Examples include an electric vehicle, a hybrid vehicle, and a plug-in hybrid vehicle, each of which utilizes electric motors to generate driving force using electric energy instead of a conventional internal combustion engine that generates driving force by burning fossil fuel and releases pollutants into the environment as a result.

Each of these vehicles requires an inverter for converting direct current power stored in a battery to alternating current in order to drive the electric motor that supplies power to the wheels of the vehicle. The inverter includes a plurality of power semiconductor devices which convert the direct current power to alternating current and a gate driving apparatus which provides a gate driving signal to a gate of each of the power semiconductor devices for executing on/off control of the power semiconductor device.

Typically, there is a wide range of magnitudes of electric current flowing from a collector (drain) of the power semiconductor device to an emitter (source). Thus, a conventional gate driving apparatus determines the capacity of an off-resistor provided between the gate of the power semiconductor device and a ground, in which the gate driving signal for turning off the power semiconductor device is input to the gate.

Conventionally, since the off-resistor includes a large capacity, and a high level of electric current may flow from the collector (drain) of the power semiconductor device to the emitter (source) thereof, switching may be slow due to excessive resistance when turning off the power semiconductor device at a low level current. Therefore, the turn-off loss is increased due to a tail current, thereby reducing overall efficiency.

The foregoing is intended merely to aid in the understanding of the background of the present disclosure, and is not intended to mean that the present disclosure falls within the purview of the related art that is already known to those skilled in the art.

SUMMARY OF THE DISCLOSURE

Accordingly, the present disclosure has been made keeping in mind the above problems occurring in the related art, and the present disclosure proposes a gate driving apparatus for a power semiconductor device, which can reduce the capacity of an off-resistor connected to a gate of the power semiconductor device based on an electric current flowing from a collector (drain) of the power semiconductor device to an emitter (source) of the power semiconductor device, thereby reducing loss when turning off the power semiconductor device and increasing overall efficiency.

In order to achieve the technical problem, according to embodiments of the present disclosure, a gate driving apparatus for a power semiconductor device may include: a first off-resistor and a second off-resistor each having a first end connected to a gate of the power semiconductor device; a first off-switch configured to determine a connection state between a second end of the first off-resistor and a ground based on a gate driving signal for determining an on/off state of the power semiconductor device; a second off-switch configured to determine a connection state between a second end of the second off-resistor and the ground; an electric current detector configured to detect an electric current flowing from a collector (drain) of the power semiconductor device to an emitter (source) of the power semiconductor device; and a controller configured to determine an open/closed state of the second off-switch based on the gate driving signal and a magnitude of the electric current detected by the electric current detector.

The apparatus may further include: a gate driver configured to output the gate driving signal; an on-switch that is closed within a high-level-section of the gate driving signal and is open within an off-section of the gate driving signal; and an on-resistor connected between the on-switch and the gate of the power semiconductor device.

When the on-switch is closed, a power source voltage is applied to the gate of the power semiconductor device through the on-resistor.

The first off-switch may be open within a high-level-section of the gate driving signal and may be closed within a low-level-section of the gate driving signal.

When the magnitude of the electric current detected by the electric current detector is between a preset first level and a preset second level higher than the first level, and the gate driving signal is a low-level signal, the controller may allow the second off-switch to be closed.

The electric current detector may detect a voltage between the collector (drain) of the power semiconductor device and the emitter (source) of the power semiconductor device based on a predetermined current and voltage characteristics between the collector (drain) of the power semiconductor device and the emitter (source) of the power semiconductor device, and determine whether the electric current flowing from the collector (drain) of the power semiconductor device to the emitter (source) of the power semiconductor device is between a preset first level and a preset second level higher than the preset first level.

The electric current detector may include: a first comparator configured to compare a first reference voltage corresponding to the preset first level with the voltage between the collector (drain) of the power semiconductor device and the emitter (source) of the power semiconductor device; and a second comparator configured to compare a second reference voltage corresponding to the preset second level with the voltage between the collector (drain) of the power semiconductor device and the emitter (source) of the power semiconductor device.

The first comparator may be a non-inverting comparator having an inverting input terminal to which the first reference voltage is input and a non-inverting input terminal to which the voltage between the collector (drain) of the power semiconductor device and the emitter (source) of the power semiconductor device is input, and the second comparator may be an inverting comparator having a non-inverting input terminal to which the second reference voltage is input and an inverting input terminal to which the voltage between the collector (drain) of the power semiconductor device and the emitter (source) of the power semiconductor device is input.

The electric current detector may include: a diode having a cathode that is connected to the collector (drain) of the power semiconductor device; and a capacitor connected between the emitter (source) of the power semiconductor device and an anode of the diode. Connecting nodes between the diode and the capacitor may be connected to an input terminal of the first comparator and to an input terminal of the second comparator, respectively.

The apparatus may further include: a protection circuit configured to determine whether an excessive voltage is applied to the collector (drain) of the power semiconductor device.

The protection circuit may include a plurality of voltage dividing resistors configured to divide a power source voltage that applies a voltage to the collector (drain) of the power semiconductor device; and a comparator configured to compare the voltage divided by the plurality of voltage dividing resistors with a reference voltage corresponding to a preset third level higher than the preset second level.

Furthermore, according to embodiments of the present disclosure, a gate driving apparatus for a power semiconductor device may include: a gate driver configured to output a gate driving signal that determines whether the power semiconductor device is on or off; a first off-switch that is open within a high-level-section of the gate driving signal and is closed within a low-level-section of the gate driving signal; a first off-resistor connected between the first off-switch and a gate of the power semiconductor device; a second off-switch that is open within the high-level-section of the gate driving signal and is closed when a magnitude of an electric current flowing from a collector (drain) of the power semiconductor device to an emitter (a source) of the power semiconductor device is between a preset first level and a preset second level higher than the preset first level, and the gate driving signal is within the low-level-section; and a second off-resistor connected between the second off-switch and the gate of the power semiconductor device.

When the first off-switch or the second off-switch is closed, the first off-resistor or the second off-resistor may be connected to a ground.

The apparatus may further include: an electric current detector configured to detect the electric current flowing from the collector (drain) of the power semiconductor device to the emitter (source) of the power semiconductor device and to determine whether the detected electric current is between the preset first level and the preset second level; and a controller configured to determine an open/closed state of the second off-switch based on whether the detected electric current is between the preset first level and the preset second level and whether a level of the gate driving signal is high or low.

The electric current detector may include: a first comparator configured to compare a first reference voltage corresponding to the preset first level determined based on a predetermined electric current and voltage characteristics between the collector (drain) of the power semiconductor device and the emitter (source) of the power semiconductor device with a voltage between the collector (drain) of the power semiconductor device and the emitter (source) of the power semiconductor device; and a second comparator configured to compare a second reference voltage corresponding to the preset second level determined based on the predetermined electric current and voltage characteristics between the collector (drain) of the power semiconductor device and the emitter (source) of the power semiconductor device with the voltage between the collector (drain) of the power semiconductor device and the emitter (source) of the power semiconductor device.

A first comparator may compare a first reference voltage corresponding to the preset first level determined based on a predetermined electric current and voltage characteristics between the collector (drain) of the power semiconductor device and the emitter (source) of the power semiconductor device with a voltage between the collector (drain) of the power semiconductor device and the emitter (source) of the power semiconductor device; and a second comparator may compare a second reference voltage corresponding to the preset second level determined based on the predetermined electric current and voltage characteristics between the collector (drain) of the power semiconductor device and the emitter (source) of the power semiconductor device with the voltage between the collector (drain) of the power semiconductor device and the emitter (source) of the power semiconductor device.

The electric current detector may include: a diode having a cathode that is connected to the collector (drain) of the power semiconductor device; and a capacitor connected between the emitter (source) of the power semiconductor device and an anode of the diode. Here, connecting nodes between the diode and the capacitor may be connected to an input terminal of the first comparator and to an input terminal of the second comparator, respectively.

The apparatus may further include: a protection circuit configured to determine whether an excessive voltage is applied to the collector (drain) of the power semiconductor device.

The protection circuit may include: a plurality of voltage dividing resistors configured to divide a power source voltage that applies a voltage to the collector (drain) of the power semiconductor device; and a comparator configured to compare the voltage divided by the plurality of voltage dividing resistors with a reference voltage corresponding to a preset third level higher than the preset second level.

According to the gate driving apparatus for a power semiconductor device discussed herein, the gate driving apparatus reduces the total off-resistance value by connecting an additional off-resistor within a desired range of electric current in parallel with an off-resistor preset to have a high resistance value in advance for a safe operation in a wide electric current section. Thus, the turn-off loss due to the tail current caused by an off-resistor having a high resistance value may be reduced, and overall efficiency may be increased.

BRIEF DESCRIPTION OF THE DRAWINGS

The above and other objects, features and other advantages of the present disclosure will be more clearly understood from the following detailed description when taken in conjunction with the accompanying drawings.

FIG. 2 is a graph showing the characteristics of voltage/electric current between a collector (drain) and an emitter (source) when the power semiconductor device is turned on.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment

DETAILED DESCRIPTION OF THE DISCLOSURE

Hereinafter, embodiments of the present disclosure will be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. The controller may control operation of units, modules, parts, devices, or the like, as described herein. Moreover, it is understood that the below methods may be executed by an apparatus comprising the controller in conjunction with one or more other components, as would be appreciated by a person of ordinary skill in the art.

Furthermore, the controller of the present disclosure may be embodied as non-transitory computer readable media containing executable program instructions executed by a processor. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed throughout a computer network so that the program instructions are stored and executed in a distributed fashion, e.g., by a telematics server or a Controller Area Network (CAN).

Hereinbelow, a gate driving apparatus for a power semiconductor device according to various embodiments of the present disclosure will be described in detail with reference to the accompanying drawings.

Figure 1:
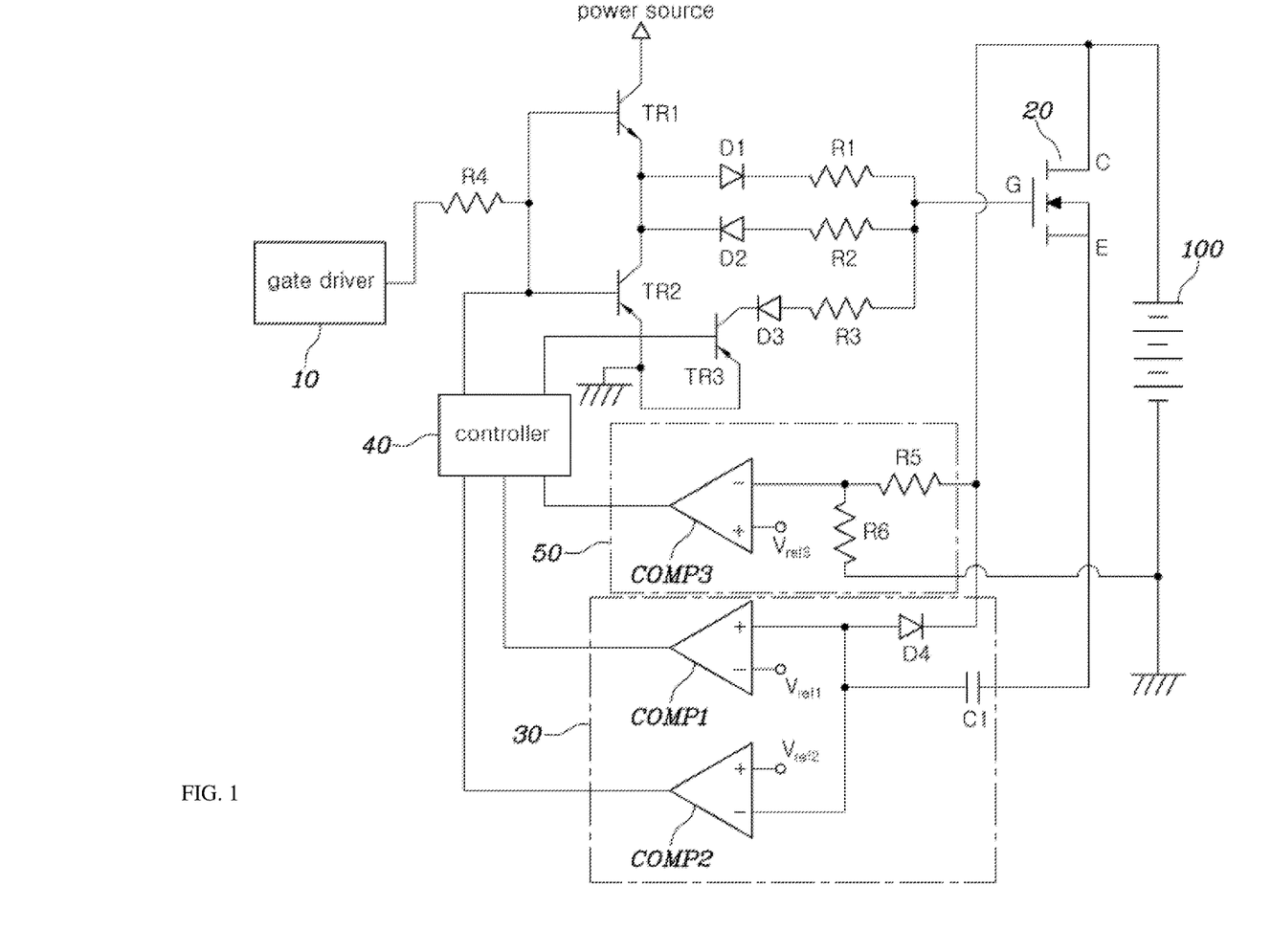
FIG. 1 is a circuit diagram showing a gate driving apparatus for a power semiconductor device according to embodiments of the present disclosure.

FIG. 1 is a circuit diagram showing the gate driving apparatus for the power semiconductor device according to embodiments of the present disclosure.

As shown in FIG. 1, the gate driving apparatus for the power semiconductor device according to embodiments of the present disclosure is an apparatus for driving a gate G of the power semiconductor device 20 on the basis of a gate driving signal output from a gate driver 10. The gate driving apparatus may include: a first off-resistor R2 and a second off-resistor R3 each connected to the gate G of the power semiconductor device 20; a first off-switch TR2 for determining a connection state between the first off-resistor R2 and a ground; a second off-switch TR3 for determining a connection state between the second off-resistor R3 and the ground; an electric current detector 30 for detecting an electric current flowing from a collector (drain) of the power semiconductor device 20 to an emitter (source) thereof; and a controller 40 for determining a connection state of the second off-switch TR3 on the basis of the magnitude of the electric current detected by the electric current detector 30 and the gate driving signal.

The gate driver 10 outputs the gate driving signal for determining an on/off state of the power semiconductor device 20. For example, when the power semiconductor device 20 is used in an inverter for driving a motor, a pulse width modulation signal that is used for realizing a three-phase AC voltage determined by a controller for controlling the motor is input to the gate driver 10. Further, the gate driver 10 outputs the gate driving signal to control the power semiconductor device 20 so as to bring the power semiconductor device 20 into an on/off state corresponding to the pulse width modulation signal.

The power semiconductor device 20 is a switching element which is provided in an electric power control circuit (e.g., an inverter) and of which the collector (drain) and the emitter (source) are closed or open under the control of a gate voltage. A voltage of a high voltage power source such as a high voltage battery may be applied to the collector (drain) of the power semiconductor device 20.

The gate driving signal output from the gate driver 10 may be a pulse signal of a high- or low-level. In addition, the gate driver 10 may be realized in the form of an integrated circuit in an actual hardware.

The gate of the power semiconductor device 20 has a circuit for applying the signal by which the power semiconductor device 20 is on/off. The circuit may include: an on-switch TR1; the first off-switch TR2; diodes D1 and D2; an on-resistor R1; and the first off-resistor R2.

The on-switch TR1 may be realized as an npn transistor. Here, the gate driving signal may be applied to a base of the on-switch TR1, a power source voltage is applied to the collector of the on-switch TR1, and the emitter of the on-switch TR1 may be connected to the collector of the first off-switch TR2

The first off-switch TR2 may be realized as a pnp transistor. Here, the gate driving signal is applied to a base of the first off-switch TR2, the collector of the first off-switch TR2 may be connected to the emitter of the on-switch TR1, and the emitter of the first off-switch TR2 may be grounded.

Connecting nodes of the on-switch TR1 and the first off-switch TR2 (i.e., the emitter of the on-switch TR1 and the collector of the first off-switch TR2) may be respectively connected to a first diode D1 and the on-resistor in series, and to a second diode D2 and the first off-resistor R2 in series.

The on-resistor R1 and the first off-resistor R2 may be connected to the gate of the power semiconductor device 20. Here, an anode of the first diode D1 is connected to the connecting node of the on-switch TR1 and the first off-switch TR2, and a cathode of the first diode D1 is connected to the on-resistor R1. Further, a cathode of the second diode D2 is connected to the connecting node of the on-switch TR1 and the first off-switch TR2, and an anode of the second diode D2 is connected to the first off-resistor R2.

In the circuit having the above structure, when the gate driving signal is in a high level, the on-switch TR1 that is the npn transistor is turned on (closed state), and the first off-switch TR2 that is the pnp transistor is turned off (open state), so a path is formed between the power source and the gate of the power semiconductor device 20 through the first diode D1 and the on-resistor R1, thus the power semiconductor device 20 is turned on. In addition, when the gate driving signal is in a low level, the on-switch TR1 that is the npn transistor is turned off (open state), and the first off-switch TR2 that is the pnp transistor is turned on (closed state), so a path is formed between the ground and the gate of the power semiconductor device 20 through the second diode D2 and the first off-resistor R2, thus the power semiconductor device 20 is turned off.

In the circuit described above, when the power semiconductor device 20 is inverted from the on state to the off state, the resistance value of the first off-resistor R2 is determined as a relative high value so that the magnitude of the electric current flowing from the collector (drain) to the emitter (source) is stably off within a range of a zero to a preset reference value. When the resistance value of the first off-resistor R2 is determined as a high value, switching during the turn-off of the power semiconductor device 20 becomes slower, and the turn-off loss increases due to a tail current, thus reducing efficiency.

According to embodiments of the present disclosure, in order to solve the problem of reduction in the efficiency, the capacity of an off-resistor may be reduced to enable fast switching when the magnitude of the electric current flowing from the collector (drain) the power semiconductor device 20 to the emitter (source) thereof is within a preset range.

In order to achieve the above objective, the embodiment of the present disclosure provides: an electric current detector 30 for detecting the magnitude of an electric current flowing from the collector (drain) of the power semiconductor device 20 to the emitter (source) thereof; and an additional second off-switch TR3 for connecting the second off-resistor R3 with the first off-resistor R2 in parallel when it is required to turn off the second off-resistor R3 and the power semiconductor device 20.

In other words, when the magnitude of an electric current that flows from the collector (drain) to the emitter (source) and is detected by the electric current detector 30 is within a preset reference range, the second off-switch TR3 is turned on, and the second off-resistor R3 is connected between the gate of the power semiconductor device 20 and the ground, so the second off-resistor R3 is connected with the first off-resistor R2 in parallel. Accordingly, a combined resistance value of the first off-resistor R2 and the second off-resistor R3, which are connected in parallel to each other, is applied between the gate of the power semiconductor device 20 and the ground. Here, since the combined resistance value of the first off-resistor R2 and the second off-resistor R3 is smaller than the resistance value of the first off-resistor R2, the resistance value at an off-path of the power semiconductor device 20 is reduced, thus realizing fast switching. In other words, the problem of reduction in efficiency occurred by an increase in the turn-off loss due to the tail current may be solved.

The second off-switch TR3 may be controlled by the controller 40 that receives the electric current flowing from the collector (drain) to the emitter (source) and detected by the electric current detector 30, and determines an on/off state of the second off-switch on the basis of the magnitude of the electric current. More particular, when the controller receives the magnitude of an electric current flowing from the collector (drain) to the emitter (source) and detected by the electric current detector 30, and determines that the magnitude of the electric current is within a preset range, and when the gate driving signal provided by the gate driver 10 is within an off-section where the power semiconductor device 20 is turned off, the controller 40 may turn on the second off-switch TR3. Here, the first off-switch TR2 may be operated by the gate driving signal provided by the gate driver 10 regardless of controlling of the controller 40.

According to embodiments of the present disclosure, the electric current detector 30 may be configured to have a non-inverting comparator COMP1 and an inverting comparator COMP2, and to compare a detected value of a voltage between the collector (drain) and the emitter (source) with preset reference values Vref1, Vref2 when the power semiconductor device 20 is turned on.

Here, when the power semiconductor device 20 is turned on, the electric current detector 30 indirectly detects whether the electric current flowing from the collector (drain) of the power semiconductor device 20 to the emitter (source) thereof is within the preset range or not by detecting the voltage between the collector (drain) and the emitter (source) of the power semiconductor device 20 and by comparing the detected voltage with the preset reference value rather than directly detecting the electric current using the characteristics of voltage/electric current between the collector (drain) and the emitter (source).

Figure 2:
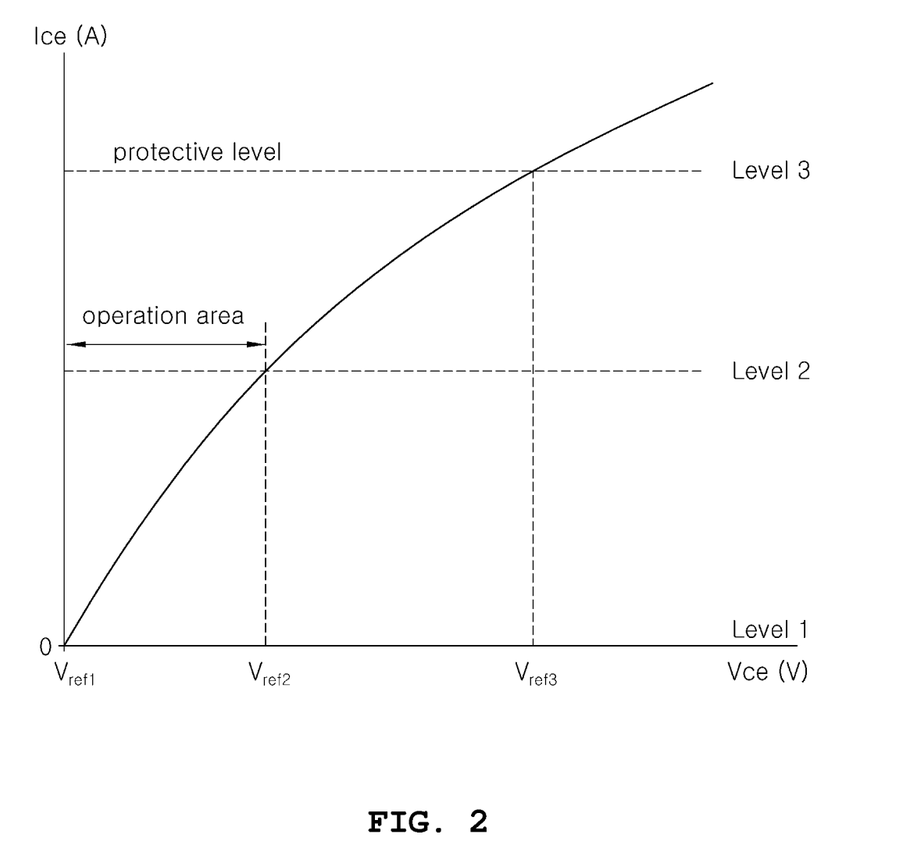

FIG. 2 is a graph showing the characteristics of voltage/electric current between the collector (drain) and the emitter (source) when the power semiconductor device is turned on.

As shown in FIG. 2, the power semiconductor device 20 has the characteristics of connection in which the voltage between the collector (drain) and the emitter (source) becomes higher as much as the electric current flowing from the collector (drain) to the emitter (source) becomes higher. When the power semiconductor device 20 is turned off, and the section of the magnitude of the electric current that can allow the second off-switch TR3 to be turned off is within from a first level 1 to a second level Level 2 in FIG. 2, the voltage value Vref1 corresponding to the first level Level 1 may be a reference value that is input to an inverting input terminal of the non-inverting comparator COMP1, and the voltage value Vref2 corresponding to the second level Level 2 may be a reference value that is input to a non-inverting input terminal of the inverting comparator COMP2.

When outputs of the non-inverting comparator COMP1 and the inverting comparator COMP2 are all high, the magnitude of the electric current flowing from the collector (drain) of the power semiconductor device 20 to the emitter (source) is within a predetermined range. Thus, in this case, the controller 40 can allow the second off-switch TR3 to be turned on when the power semiconductor device 20 is turned off. In other words, the controller 40 can allow the second off-switch TR3 to be turned on in a section denoted by the character 'R1' in FIG. 2.

The electric current detector 30 may include: a diode D4 of which a cathode is connected to the collector (drain) of the power semiconductor device 20; and a capacitor C1 connected between the emitter (source) of the power semiconductor device 20 and an anode of the diode D4. Connecting nodes of the diode D4 and the capacitor C1 may be connected to the non-inverting input terminal of the non-inverting comparator COMP1 and the inverting input terminal of the inverting comparator COMP2, respectively. In the circuit structure, a value subtracted a threshold voltage of the diode D4 from the voltage between the collector (drain) of the power semiconductor device 20 and the emitter (source) thereof may be applied to the capacitor C1. Since the threshold voltage of the diode D4 has a predetermined value, the voltage applied to the capacitor C1 may correspond to the voltage between the collector (drain) and the emitter (source) of the power semiconductor device 20.

According to embodiments of the present disclosure, since the current detection result output from the non-inverting comparator COMP1 and the inverting comparator COMP2 is within a high-low state and the gate driving signal output from the gate driver 10 is also within a high-low state, the controller 40 may be realized as a simple logic circuit using the high-low state without using complex algorithms, so the circuit of the controller may be easily produced at low cost. Of course, in another embodiment, the electric current detector may be realized as a commercial electric current sensor that detects the electric current flowing from the collector (drain) of the power semiconductor device 20 to the emitter (source) thereof, and the controller may be realized as a microcomputer that receives the output of the electric current sensor and determines on/off of the second off-switch TR3 using a pre-programmed determination algorithm. However, this is problematic in that it is difficult to operate quickly due to limitations of an operational cycle of the microcomputer, and the production of the electric current detector and the controller requires high cost and a complicated process.

According to embodiments of the present disclosure, the gate driving apparatus may further include: a protection circuit 50 for blocking an excessive electric current flowing between the collector (drain) and the emitter (source), when an excessive voltage is applied to the collector (drain) of the power semiconductor device 20.

When a voltage Vref3 corresponding to a protective electric current level that is a third level Level 3 is applied between the collector (drain) of the power semiconductor device 20 and the emitter (source) thereof, the protection circuit 50 may be provided to detect the voltage and notify the application of the voltage. The protection circuit 50 may include: a voltage dividing resistors R5 and R6 for dividing a voltage of a power source 100 that applies an excessive voltage to the collector (drain) of the power semiconductor device; and a comparator COMP3 for comparing the voltage divided by the voltage dividing resistors R5 and R6 with the preset reference value Vref3 corresponding to the third level Level 3 in FIG. 1.

In the example shown in FIG. 1, the comparator COMP3 is configured to output a low-level signal when the value divided by the inverting comparator is higher than the preset reference value Vref3. However, the comparator COMP3 may be realized as a non-inverting comparator without being limited thereto.

Figure 3:
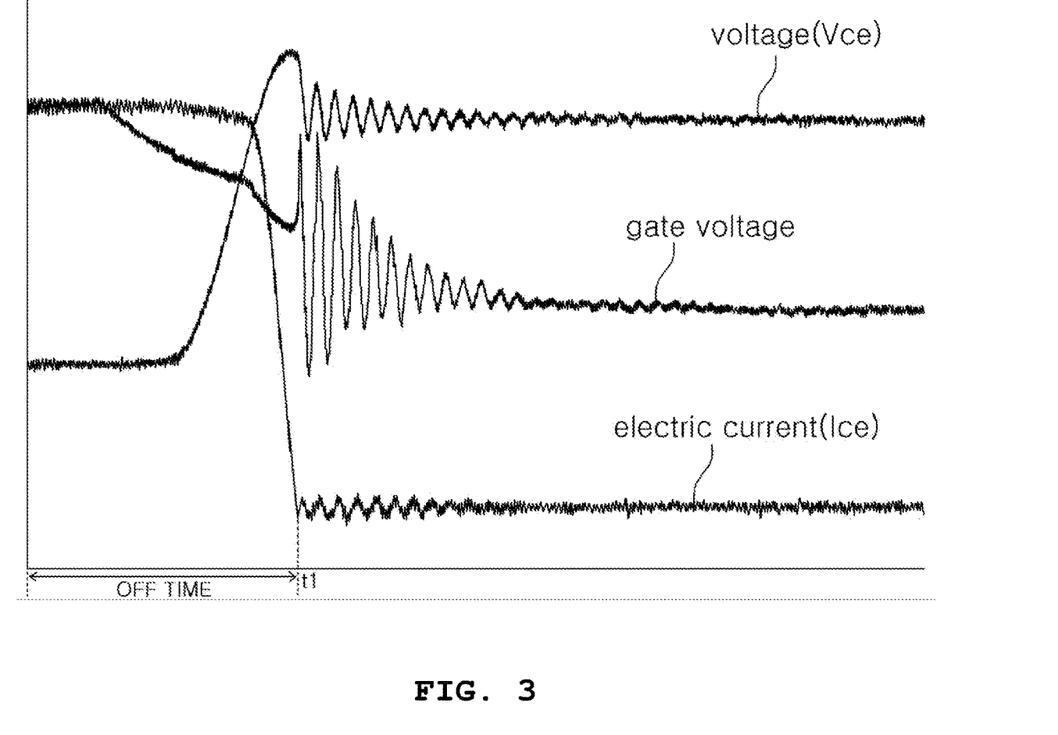
FIGS. 3 and 4 are graphs respectively showing a driving technique of the power semiconductor device according to the embodiment of the present disclosure and a driving technique of a conventional power semiconductor device.
Figure 4:
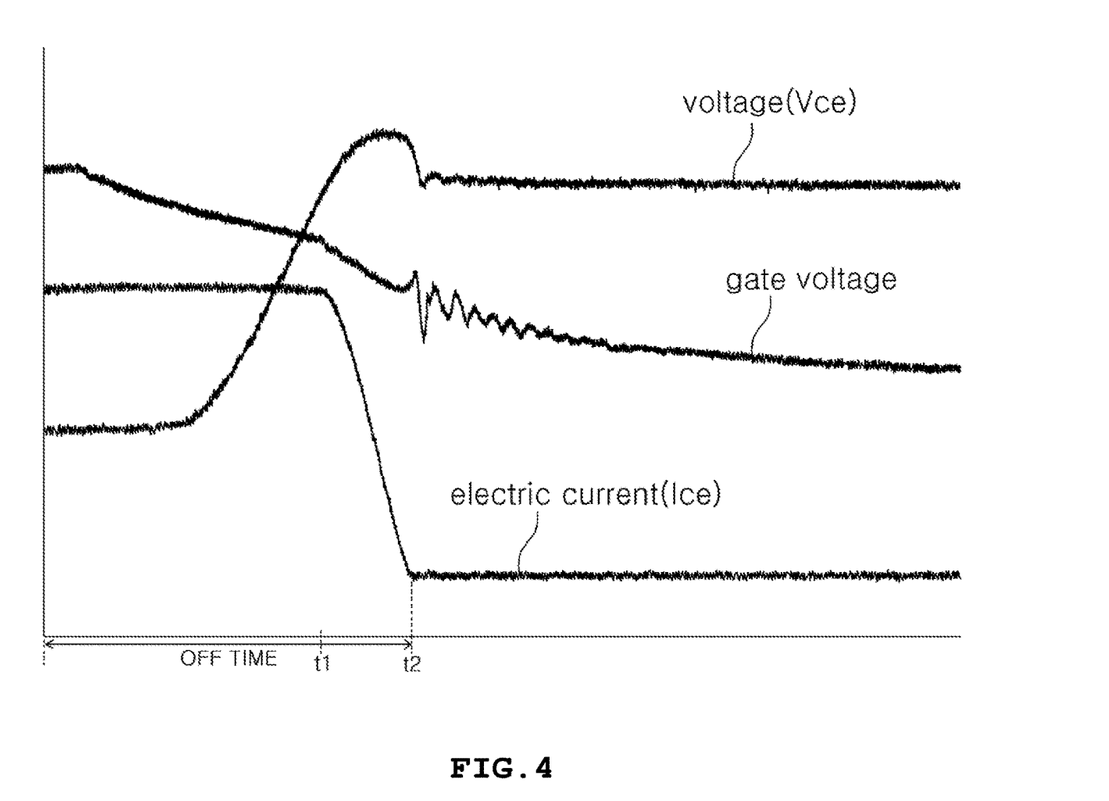

FIGS. 3 and 4 are graphs respectively showing a driving technique of the power semiconductor device according to embodiments of the present disclosure and a driving technique of a conventional power semiconductor device.

As shown in FIGS. 3 and 4, according to embodiments of the present disclosure, the time during which the electric current flowing from the collector (drain) of the power semiconductor device 20 to the emitter (source) thereof is turned off is remarkably reduced compared to the conventional power semiconductor device.

As described above, according to the various embodiments of the present disclosure, the gate driving apparatus for the power semiconductor device is configured to reduce the total off-resistance value by connecting an additional off-resistor within a desired range of electric current in parallel to an off-resistor preset to have a high resistance value in advance for a safe operation in a wide electric current section, the turn-off loss due to the tail current caused by an off-resistor having a high resistance value may be reduced, thereby increasing the efficiency.

Although certain embodiments of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. A gate driving apparatus for a power semiconductor device, the apparatus comprising:
   a first off-resistor and a second off-resistor each having a first end connected to a gate of the power semiconductor device;
   a first off-switch configured to determine a connection state between a second end of the first off-resistor and a ground based on a gate driving signal for determining an on/off state of the power semiconductor device;
   a second off-switch configured to determine a connection state between a second end of the second off-resistor and the ground;
   an electric current detector configured to detect an electric current flowing from a collector (drain) of the power semiconductor device to an emitter (source) of the power semiconductor device; and
   a controller configured to determine an open/closed state of the second off-switch based on the gate driving signal and a magnitude of the electric current detected by the electric current detector,
   wherein the electric current detector is configured to detect a voltage between the collector (drain) of the power semiconductor device and the emitter (source) of the power semiconductor device based on a predetermined current and voltage characteristics between the collector (drain) of the power semiconductor device and the emitter (source) of the power semiconductor device, and to determine whether the electric current flowing from the collector (drain) of the power semiconductor device to the emitter (source) of the power semiconductor device is between a preset first level and a preset second level higher than the preset first level,
   wherein the electric current detector includes:
   a first comparator configured to compare a first reference voltage corresponding to the present first level with the voltage between the collector (drain) of the power semiconductor device and the emitter (source) of the power semiconductor device; and a second comparator configured to compare a second reference voltage corresponding to the preset second level with the voltage between the collector (drain) of the power semiconductor device and the emitter (source) of the power semiconductor device wherein the first comparator is a non-inverting comparator having an inverting input terminal to which the first reference voltage is input and a non-inverting input terminal to which the voltage between the collector (drain) of the power semiconductor device and the emitter (source) of the power semiconductor device is input, and wherein the second comparator is an inverting comparator having a non-inverting input terminal to which the second reference voltage is input and an inverting input terminal to which the voltage between the collector (drain) of the power semiconductor device and the emitter (source) of the power semiconductor device is input.

2. The apparatus of claim 1, further comprising:
a gate driver configured to output the gate driving signal;
an on-switch that is closed within a high-level-section of the gate driving signal and is open within an off-section of the gate driving signal; and
an on-resistor connected between the on-switch and the gate of the power semiconductor device,
wherein, when the on-switch is closed, a power source voltage is applied to the gate of the power semiconductor device through the on-resistor.

3. The apparatus of claim 1, wherein the first off-switch is open within a high-level-section of the gate driving signal and is closed within a low-level-section of the gate driving signal.

4. The apparatus of claim 3, wherein, when the magnitude of the electric current detected by the electric current detector is between a preset first level and a preset second level higher than the first level, and the gate driving signal is a low-level signal, the controller allows the second off-switch to be closed.

5. The apparatus of claim 1, wherein the electric current detector further includes:
a diode having a cathode that is connected to the collector (drain) of the power semiconductor device; and
a capacitor connected between the emitter (source) of the power semiconductor device and an anode of the diode,
wherein connecting nodes between the diode and the capacitor are connected to an input terminal of the first comparator and to an input terminal of the second comparator, respectively.

6. The apparatus of claim 4, further comprising:
a protection circuit configured to determine whether an excessive voltage is applied to the collector (drain) of the power semiconductor device.

7. The apparatus of claim 6, wherein the protection circuit includes:
a plurality of voltage dividing resistors configured to divide a power source voltage that applies a voltage to the collector (drain) of the power semiconductor device; and
a comparator configured to compare the voltage divided by the plurality of voltage dividing resistors with a reference voltage corresponding to a preset third level higher than the preset second level.

8. A gate driving apparatus for a power semiconductor device, the apparatus comprising:

a gate driver configured to output a gate driving signal that determines whether the power semiconductor device is on or off;
a first off-switch that is open within a high-level-section of the gate driving signal and is closed within a low-level-section of the gate driving signal;
a first off-resistor connected between the first off-switch and a gate of the power semiconductor device;
a second off-switch that is open within the high-level-section of the gate driving signal and is closed when a magnitude of an electric current flowing from a collector (drain) of the power semiconductor device to an emitter (a source) of the power semiconductor device is between a preset first level and a preset second level higher than the preset first level, and the gate driving signal is within the low-level-section;
a second off-resistor connected between the second off-switch and the gate of the power semiconductor device; and
a protection circuit configured to determine whether an excessive voltage is applied to the collector (drain) of the power semiconductor device,
wherein, when the first off-switch or the second off-switch is closed, the first off-resistor or the second off-resistor is connected to a ground, and
wherein the protection circuit includes:
a plurality of voltage dividing resistors configured to divide a power source voltage that applies a voltage to the collector (drain) of the power semiconductor device; and
a comparator configured to compare the voltage divided by the plurality of voltage dividing resistors with a reference voltage corresponding to a preset third level higher than the preset second level.

9. The apparatus of claim 8, further comprising:
an electric current detector configured to detect the electric current flowing from the collector (drain) of the power semiconductor device to the emitter (source) of the power semiconductor device and to determine whether the detected electric current is between the preset first level and the preset second level; and
a controller configured to determine an open/closed state of the second off-switch based on whether the detected electric current is between the preset first level and the preset second level and whether a level of the gate driving signal is high or low.

10. The apparatus of claim 9, wherein the electric current detector includes:
a first comparator configured to compare a first reference voltage corresponding to the preset first level determined based on a predetermined electric current and voltage characteristics between the collector (drain) of the power semiconductor device and the emitter (source) of the power semiconductor device with a voltage between the collector (drain) of the power semiconductor device and the emitter (source) of the power semiconductor device; and
a second comparator configured to compare a second reference voltage corresponding to the preset second level determined based on the predetermined electric current and voltage characteristics between the collector (drain) of the power semiconductor device and the emitter (source) of the power semiconductor device with the voltage between the collector (drain) of the power semiconductor device and the emitter (source) of the power semiconductor device.

11. The apparatus of claim 10, wherein the first comparator is a non-inverting comparator having an inverting input terminal to which the first reference voltage is input and a non-inverting input terminal to which the voltage between the collector (drain) of the power semiconductor device and the emitter (source) of the power semiconductor device is input, and the second comparator is an inverting comparator having a non-inverting input terminal to which the second reference voltage is input and an inverting input terminal to which the voltage between the collector (drain) of the power semiconductor device and the emitter (source) of the power semiconductor device is input.

12. The apparatus of claim 10, wherein the electric current detector further includes;

a diode having a cathode that is connected to the collector (drain) of the power semiconductor device; and a capacitor connected between the emitter (source) of the power semiconductor device and an anode of the diode, wherein connecting nodes between the diode and the capacitor are connected to an input terminal of the first comparator and to an input terminal of the second comparator, respectively.

* * * * *